US011108602B2

United States Patent
Alkan et al.

(10) Patent No.: US 11,108,602 B2
(45) Date of Patent: Aug. 31, 2021

(54) SYSTEMS AND METHODS FOR SUPPRESSING RADIOFREQUENCY NOISE

(71) Applicant: PPC BROADBAND, INC., East Syracuse, NY (US)

(72) Inventors: Erdogan Alkan, Manlius, NY (US); André Martineau, Manlius, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 172 days.

(21) Appl. No.: 16/377,576

(22) Filed: Apr. 8, 2019

(65) Prior Publication Data

US 2019/0363915 A1 Nov. 28, 2019

Related U.S. Application Data

(60) Provisional application No. 62/674,923, filed on May 22, 2018.

(51) Int. Cl.
| | |
|---|---|
| *H04L 25/08* | (2006.01) |
| *H04B 1/12* | (2006.01) |
| *H03H 1/00* | (2006.01) |
| *H01F 17/06* | (2006.01) |

(52) U.S. Cl.
CPC ......... *H04L 25/085* (2013.01); *H01F 17/062* (2013.01); *H03H 1/0007* (2013.01); *H04B 1/12* (2013.01); *H03H 2001/0092* (2013.01)

(58) Field of Classification Search
CPC ... H04L 25/085; H01F 17/062; H03H 1/0007; H03H 2001/0092; H04B 1/12

USPC .......................................................... 375/258
See application file for complete search history.

(56) References Cited

U.S. PATENT DOCUMENTS

| | | | | |
|---|---|---|---|---|
| 5,091,707 | A | * | 2/1992 | Wollmerschauser .. H04B 15/02 333/12 |
| 2002/0063474 | A1 | | 5/2002 | Wasaki et al. |
| 2005/0156796 | A1 | | 7/2005 | Nysen |
| 2010/0027599 | A1 | * | 2/2010 | Di Chiro ................ H04B 3/542 375/222 |
| 2010/0226500 | A1 | | 9/2010 | Wang |
| 2011/0164600 | A1 | | 7/2011 | Smith |
| 2014/0130113 | A1 | * | 5/2014 | Olson .................. H04N 21/438 725/109 |

OTHER PUBLICATIONS

Shane Thomas (Authorized Officer), International Search Report and Written Opinion dated Jun. 26, 2019, PCT Application No. PCT/US2019/026288, pp. 1-11.

* cited by examiner

*Primary Examiner* — Wednel Cadeau
(74) *Attorney, Agent, or Firm* — MH2 Technology Law Group LLP

(57) ABSTRACT

A system for suppressing radiofrequency noise includes a modem and an energy transfer device. The modem includes a coaxial radiofrequency port that is configured to connect to a first ground. The energy transfer device includes a first portion and a second portion. The first portion is configured to connect to the coaxial radiofrequency port and the first ground. The second portion is configured to connect to a second ground that is isolated from the first ground. The first and second portions are configured to transfer electrical energy therebetween via electromagnetic coupling.

17 Claims, 5 Drawing Sheets

SYSTEMS AND METHODS FOR SUPPRESSING RADIOFREQUENCY NOISE

CROSS-REFERENCE TO RELATED APPLICATIONS

This application claims priority to U.S. Provisional Patent Application No. 62/674,923, filed on May 22, 2018, the entirety of which is incorporated herein by reference.

BACKGROUND

Modems are one of the main connection hubs in a subscriber's premises (e.g., a home) and allow for communication with an external network, both upstream and downstream. The modem conditions the internal communication signals (i.e., inside the home) as well as the external communication signals from the network. While communicating, the modem sends and receives desired signals between two ends (e.g., the home and network). The desired signals may be in a predetermined frequency band. For example, when the network is a cable television (CATV) network, the external network signals may be in a (CATV) frequency band.

The predetermined frequency band may also contain undesirable signals (e.g., noise). The noise may be the result of the modem having loose connectors, oxidation, and/or corrosion (e.g., on a center conductor). Each modem that generates this noise contributes to the overall/aggregate noise level in the entire CATV system. As the number of modems in the CATV system that generate noise increases, the quality of service (QoS) of the CATV system thus decreases.

SUMMARY

A system for suppressing radiofrequency noise is disclosed. The system includes a modem including a coaxial radiofrequency port that is configured to connect to a first ground. The system also includes a transformer. The transformer includes a first port, a first coil, and a second coil. The first coil is configured to connect to the first port and the first ground. The first and second coils are configured to transfer electrical energy therebetween via electromagnetic coupling. The second coil is configured to connect to a second ground that is isolated from the first ground. The system also includes a choke configured to connect to the coaxial radiofrequency port, the first port, and the first ground. The choke is configured to attenuate a shield current traveling therethrough via field conversion. The choke includes a coaxial cable that is wrapped one or more times around a toroid. The system also includes a power cord including a neutral wire that is configured to connect to the choke and the first ground. The system also includes a capacitor configured to connect to the neutral wire, the choke, and the first ground. The capacitor is configured to prevent power signals from traveling therethrough and to cause noise signals to travel back to the modem.

In another embodiment, the system includes a modem and an energy transfer device. The modem includes a coaxial radiofrequency port that is configured to connect to a first ground. The energy transfer device includes a first portion and a second portion. The first portion is configured to connect to the coaxial radiofrequency port and the first ground. The second portion is configured to connect to a second ground that is isolated from the first ground. The first and second portions are configured to transfer electrical energy therebetween via electromagnetic coupling.

In yet another embodiment, the system includes a modem and an energy transfer device. The modem includes a radiofrequency port that is configured to connect to a first ground. The energy transfer device includes a first portion that is configured to connect to the first ground. The energy transfer device also includes a second portion that is configured to connect to a second ground that is isolated from the first ground. The first and second portions are configured to transfer electrical energy therebetween via electromagnetic coupling. The energy transfer device also includes a choke that is configured to be connected to and positioned between to the radiofrequency port and the first portion.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

The present disclosure relates to systems and methods that reduce/attenuate the amount of noise generated by a faulty modem. More particularly, the systems and methods described herein reduce/attenuate the amount of noise introduced into a CATV system by a faulty modem. As used herein, a "faulty modem" refers to a modem that generates a predetermined (e.g., significant) amount of noise (e.g., in response to the modem having loose connectors, oxidation, corrosion, etc.). A predetermined or significant amount of noise can be defined as the noise signals that reduce the QoS for a premise and/or the cable system. Noise signals accumulate from multiple faulty modems in the CATV system. Thus, reducing the noise generated by the faulty modems improves the overall performance of the CATV system. As an example, with a −50 dBmV noise level, the faulty modem contribution in the return band may be as high as +3 dBmV peak.

Figure 1:
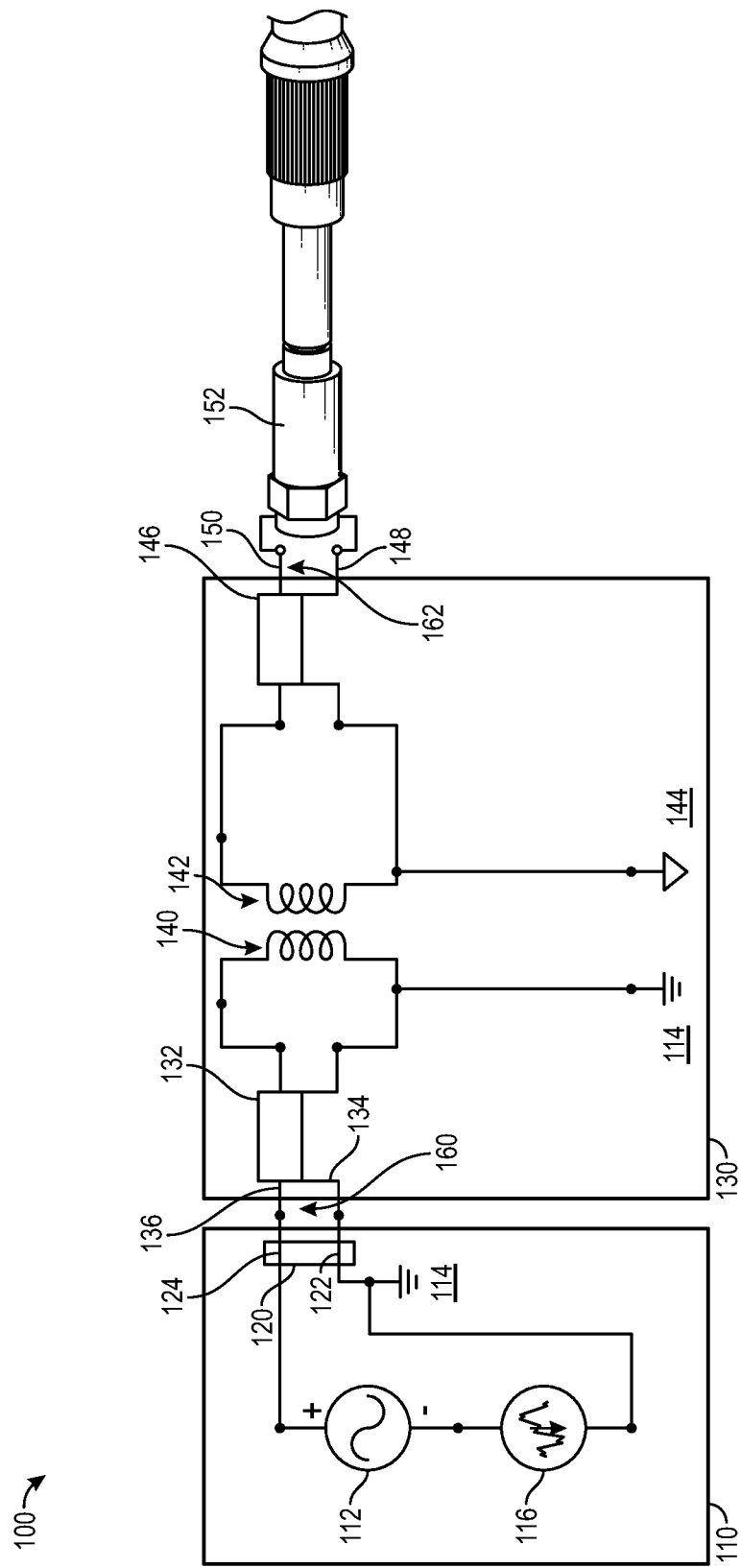
FIG. 1 illustrates a schematic view of a system including a modem with a transformer coupled thereto, according to an embodiment.

FIG. 1 illustrates a schematic view of a system 100 including a modem 110 with a transformer 130 coupled thereto, according to an embodiment. The modem 110 may include an alternating power source (i.e., $V_{modem}$) 112. The modem 110 may also include a first (e.g., modem) ground 114.

The modem 110 may also include a coaxial radiofrequency (RF) port 120 that is configured to send and receive RF communication signals. For example, when a user clicks send on an email in a computing system that is connected to the modem 110, data packets representing the email may be sent as one or more RF communication signals to the network (e.g., the internet service provider (ISP), which may be a CATV network) via the coaxial RF port 120. The coaxial RF port 120 may include a first (e.g., outer) conductor 122 and a second (e.g., inner) conductor 124. The outer conductor 122 may be connected to the modem ground 114, and the inner conductor 124 may be connected to the alternating power source 112. The inner conductor 124 may not be connected to the modem ground 114.

In at least one embodiment, the modem 110 may generate RF noise 116. In one example, the noise 116 may be due to the coaxial RF port 120 having loose connectors, oxidation, and/or corrosion. For example, the outer conductor 122 may have a loose connection with a corresponding element such as a cable.

To reduce the level of the noise 116 introduced from the modem 110 into the CATV system, the transformer 130 may be inserted/connected between the modem 110 and the CATV system. The transformer 130 may include a first transformer port (also known as a modem port) 132 that is configured to connect to the coaxial RF port 120 of the modem 110. More particularly, the modem port 132 may include a first (e.g., outer) conductor 134 and a second (e.g., inner) conductor 136 that are configured to contact/connect with the outer conductor 122 and the inner conductor 124, respectively, of the coaxial RF port 120 of the modem 110. The modem port 132 may be connected to a first coil/winding 140 of the transformer 130. The first coil 140 and the outer conductor 134 of the modem port 132 may be connected to the modem ground 114.

The transformer 130 may also include a second coil/winding 142. Electrical energy is configured to be transferred between the first and second coils 140, 142 via electromagnetic coupling. Thus, the transformer 130 may also be referred to as an energy transfer device. The second coil 142 may be connected to a second (e.g., isolation) ground 144, which is separated and isolated from the modem ground 114. As described below, having the modem ground 114 and the isolation ground 144 separated and isolated from one another may reduce the peak noise level in comparison to conventional systems that have a single, common ground. The second coil 142 and the isolation ground 144 may be connected to a second transformer port (also known as an isolated port) 146. The isolated port 146 may include a first (e.g., outer) conductor 148 and a second (e.g., inner) conductor 150. As shown, the isolated port 146 may be configured to connect to a cable 152 that leads to the CATV system (e.g., the CATV head end).

Figure 2:
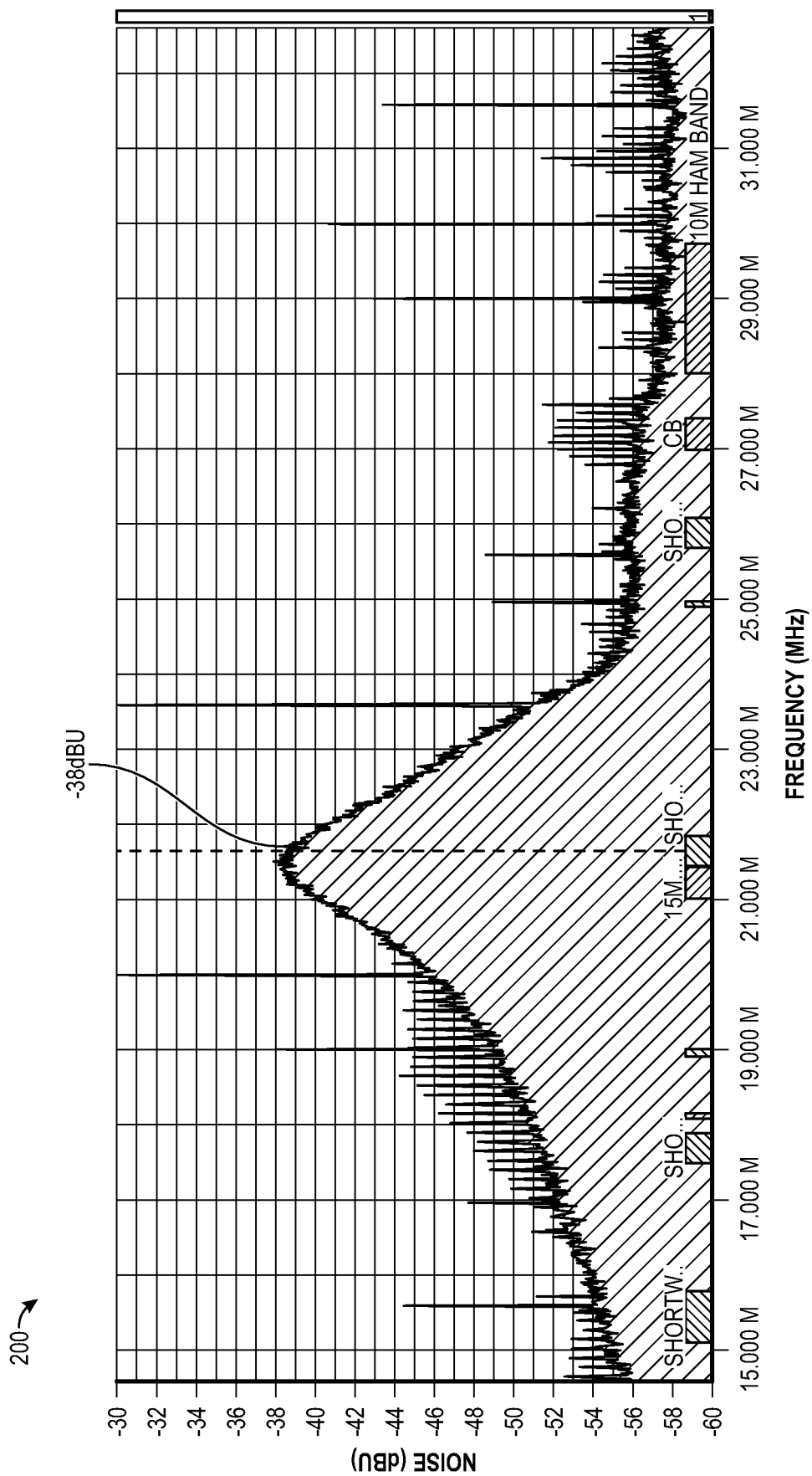
FIG. 2 illustrates a graph of an example of a noise signature at a first node in FIG. 1 when the modem is faulty, according to an embodiment.

FIG. 2 illustrates a graph 200 of an example of a noise signature at a first node 160 in FIG. 1 when the modem 110 is faulty, according to an embodiment. The first node 160 may be connected to and/or positioned between (e.g., the inner conductor 124 of) the coaxial RF port 120 of the modem 110 and (e.g., the inner conductor 136 of) the modem port 132 of the transformer 130. As may be seen in FIG. 2, when the modem 110 is faulty, a peak noise level at the first node 160 may be about −38 dBU at about 21.6 MHz.

Figure 3:
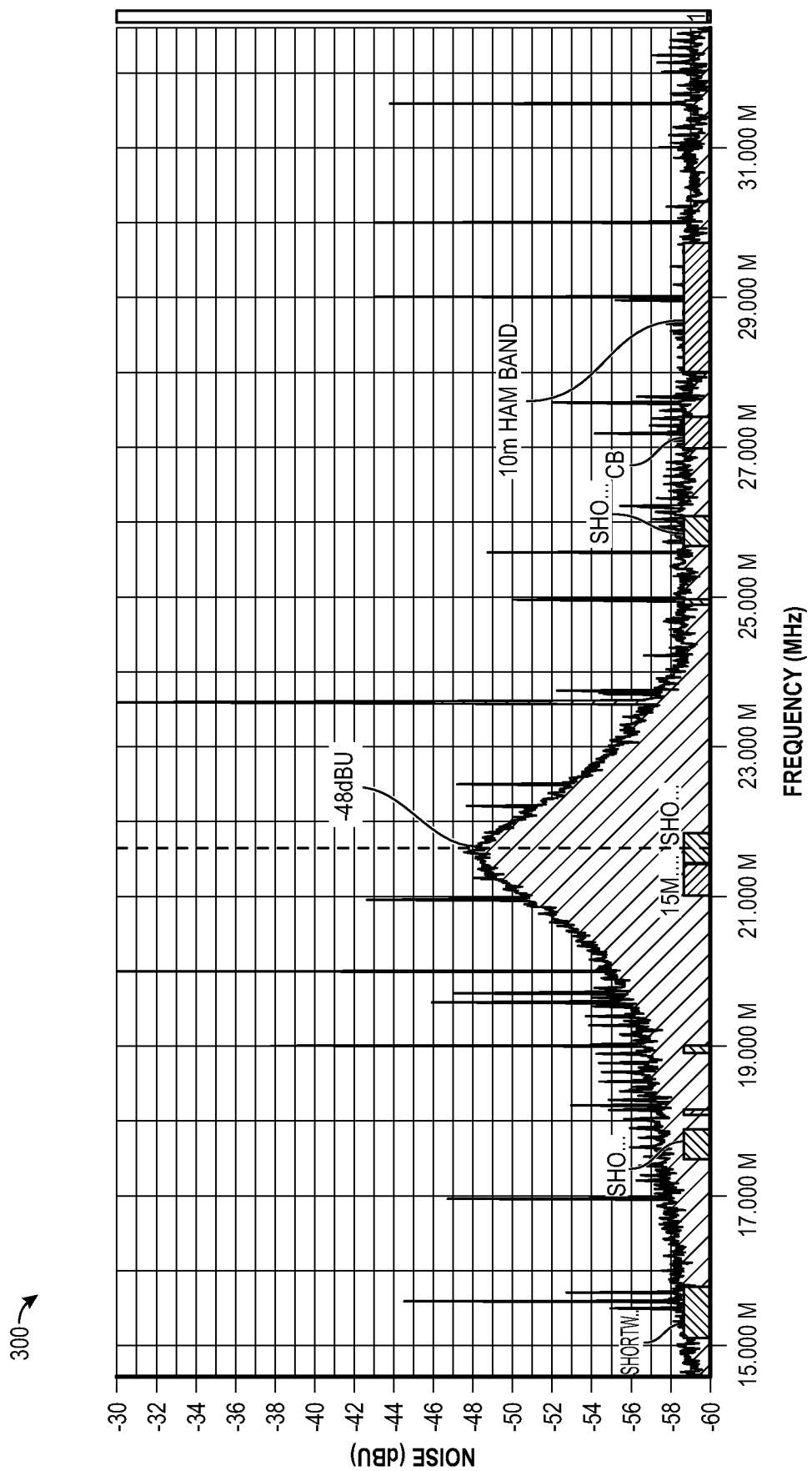
FIG. 3 illustrates a graph of an example of a noise signature at a second node in FIG. 1 when the modem is faulty, according to an embodiment.

FIG. 3 illustrates a graph 300 of an example of a noise signature at a second node 162 in FIG. 1 when the modem 110 is faulty, according to an embodiment. The second node 162 may be connected to and/or positioned between the isolated port 146 of the transformer 130 and the cable 152.

For example, the second node 162 may be connected to the inner conductor 150 of the isolated port 146. As may be seen in FIG. 3, the addition of the transformer 130 reduces the peak noise level to about −48 dBU at about 21.6 MHz. This may be at least partially due to the ground isolation provided by the transformer 130 (i.e., the two separate, isolated grounds 114, 144). Thus, as will be appreciated, the addition of the transformer 130 may reduce the peak noise level from about 4 dBU to about 16 dBU, about 6 dBU to about 14 dB, or about 8 dBU to about 12 dBU. Although the transformer 130 is shown as having a single stage, additional reduction in the peak noise level may be achieved by providing additional stages to the transformer 130 (i.e., a multi-stage transformer).

Figure 4:
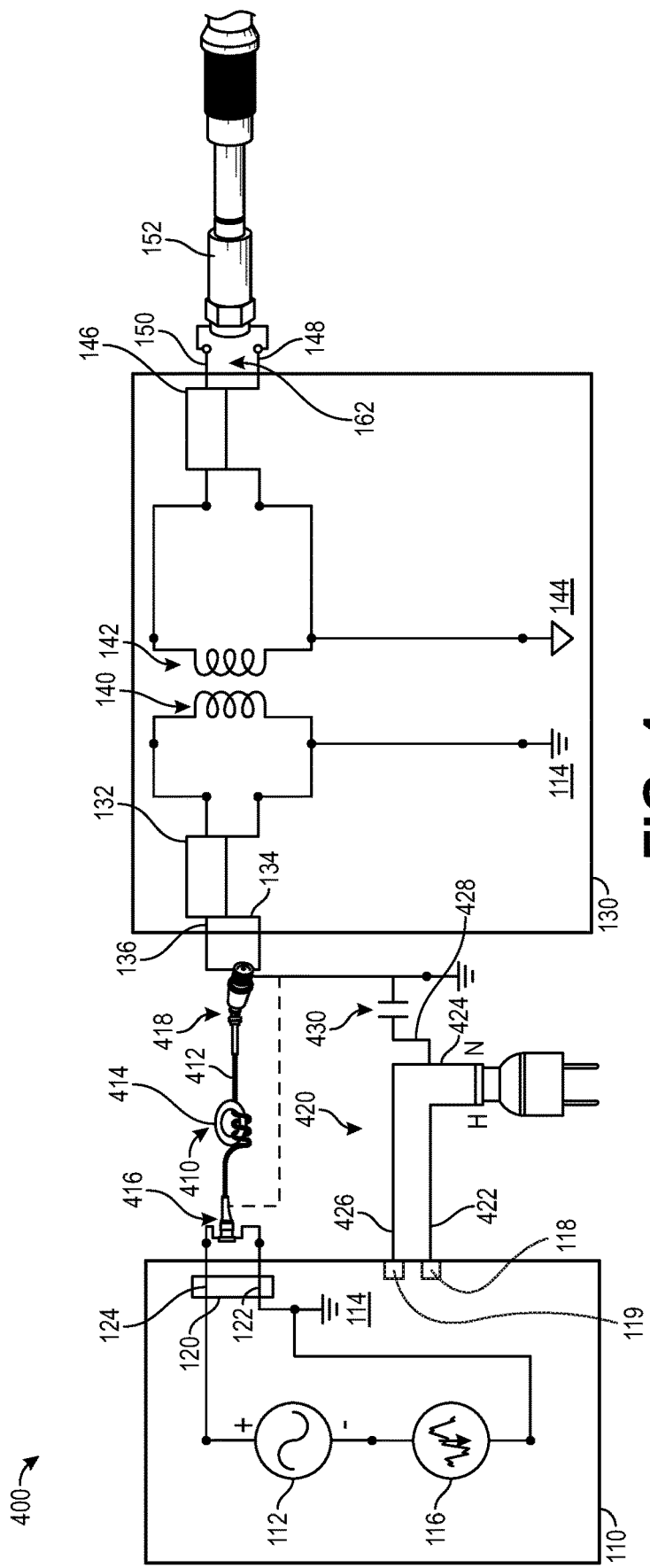
FIG. 4 illustrates a schematic view of the system of FIG. 1 with a coaxial choke and a power cord coupled thereto, according to an embodiment.

FIG. 4 illustrates another schematic view of a system 400 including the modem 110 with the transformer 130 coupled thereto, according to an embodiment. The system 400 of FIG. 4 is similar to the system 100 of FIG. 1, except for the addition of elements between the modem 110 and the transformer 130.

More particularly, a coaxial choke 410 may be connected to and positioned between the coaxial RF port 120 of the modem 110 and the modem port 132 of the transformer 130. The coaxial choke 410 may be or include a coaxial cable 412 that is wrapped one or more times around a toroid 414 to balance differential signals flowing through the outer conductor 122 and/or the inner conductor 124 of the coaxial RF port 120.

A RF transmission line system, such as the coaxial RF port 120, has two paths for currents: a forward path for current and a return path for current. In an example using the coaxial RF port 120, the inner conductor 124 may be the forward path for the current, and the outer conductor 122 may be the return path for the current. In this example, when the outer conductor 122 begins to have high contact resistance, the current going forward and backward may not be the same. This will generate an unbalanced current flow which will end up as noise to the modem 110 and/or CATV system. As this a high contact resistance or ground break, Applicant has produced one or more alternative paths to balance these different signals by adding features (e.g., the transformer 130, the coaxial choke 410, the power cord 420, etc.) in the embodiments shown herein.

The coaxial choke 410 may be configured to attenuate the undesired shield currents via field conversion through the cable 412 and/or toroid 414. More particularly, the coaxial choke 410 may be configured to attenuate the undesired shield currents before reaching the modem port 132 of the transformer 130. In at least one embodiment, the coaxial choke 410 may be referred to as a signal balancing device or a signal balancing circuit.

In addition, a power cord 420 may be connected to the modem 110. The power cord 420 may be a two-wire power cord including a first (e.g., hot) wire 422 and a second (e.g., neutral) wire 424. Although not shown, in some embodiments, the power cord 420 may instead be a three-wire power cord that also includes a ground wire. The hot wire 422 may be connected to a hot power port 118 of the modem 110. The neutral wire 424 may include a first portion 426 that is connected to a neutral power port 119 of the modem 110, and a second portion 428 that is connected to the modem ground 114. The second portion 428 may also be connected to the outer conductor 122 and/or the inner conductor 124 of the coaxial RF port 120 and/or to the modem port 132.

In at least one embodiment, the second portion 428 of the neutral wire 424 (or the ground wire in embodiments including the ground wire) may include a capacitor 430. The value of the capacitor 430 may be selected so that the noise signals can pass through the second portion 428. The capacitor 430 may have a capacitance from about 1000 pF to about 5000 pF or about 2000 pF to about 4000 pF. As an example, the capacitor 430 may have a capacitance of 3000 pF to pass noise signals above 5 MHz through the second portion 428. The capacitor 430 may serve to complete the circuit loop for noise signals. More particularly, the capacitor 430 may cause/allow noise signals from the source 116 in the modem 110 to travel back to the source 116 in the modem 110. The capacitor 430 may also or instead prevent at least a portion of a power signal (e.g., an AC or DC signal) from passing therethrough. The capacitor 430 may also or instead balance the RF signals flowing through the outer conductor 122 and/or the inner conductor 124 of the coaxial RF port 120.

In at least one embodiment, both sides/ends of the coaxial choke 410 may be connected to the modem ground 114. More particularly, the outer conductor of the end 416 of the coaxial choke 410 that is connected to the outer conductor 122 of the coaxial RF port 120 of the modem 110 may be connected to the modem ground 114. Similarly, the outer conductor of the end 418 of the coaxial choke 410 that is connected to the outer conductor 134 of the modem port 132 of the transformer 130 may be connected to the modem ground 114 and to the capacitor 430. Connecting one or both ends 416, 418 to the modem ground 114 may isolate the AC power line so that it does not have direct contact with the modem ground 114, which may improve safety for the user.

Figure 5:
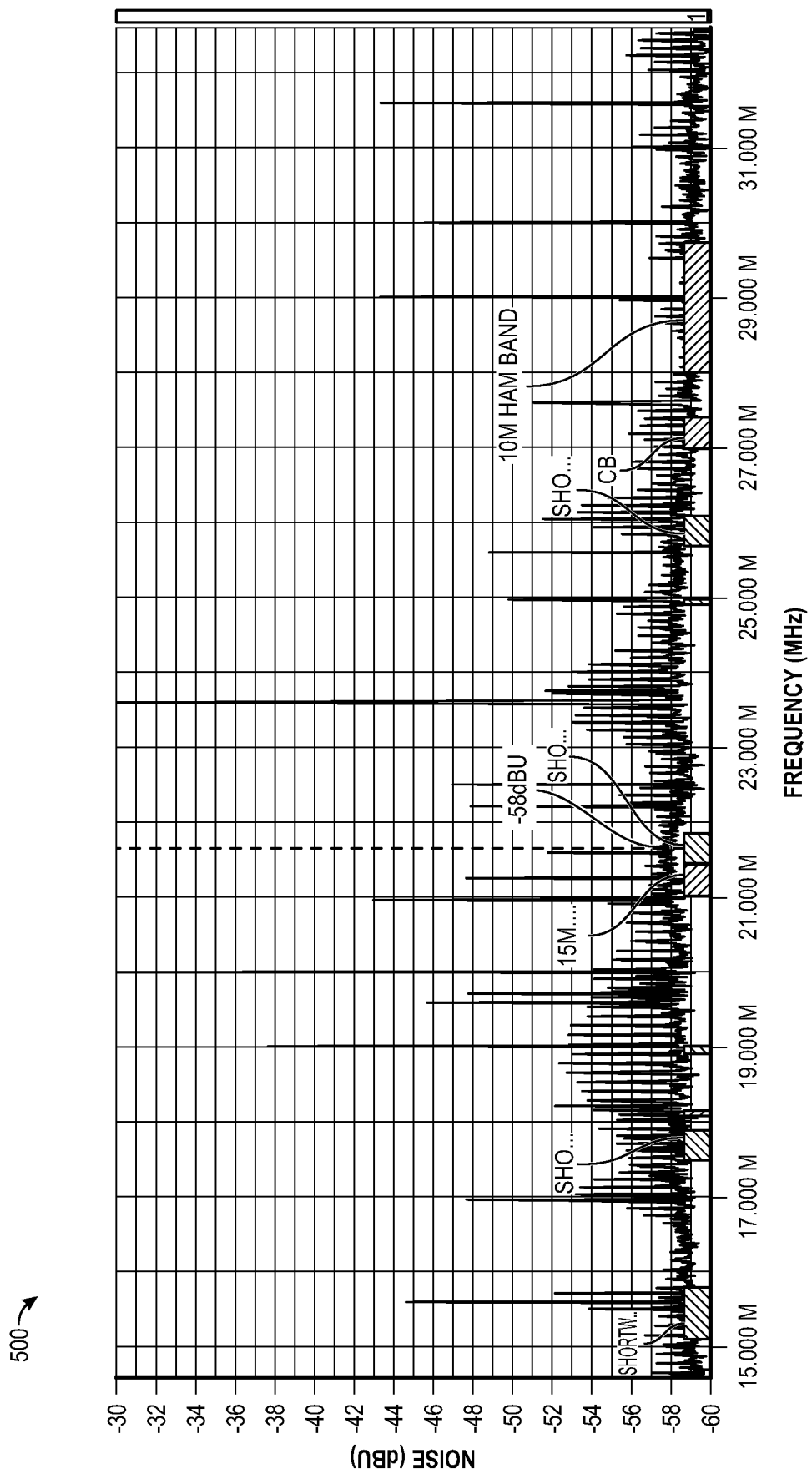
FIG. 5 illustrates a graph of an example of a noise signature at the second node in FIG. 4 when the modem is faulty, according to an embodiment.

FIG. 5 illustrates a graph 500 of an example of a noise signature at the second node 162 in FIG. 4 when the modem 110 is faulty, according to an embodiment. As may be seen in FIG. 5, the addition of the coaxial choke 410 and the power cord 420 reduces the peak noise level to about −58 dBU at about 21.6 MHz. This is a 20 dBU improvement over a conventional system (without the transformer 130, as shown in FIG. 2). This is also a 10 dBU improvement over the system 100 of FIG. 1 (with the transformer 130, as shown in FIG. 3). Thus, as will be appreciated, the addition of the transformer 130 and the coaxial choke 410 may reduce the peak noise level from about 14 dBU to about 26 dBU, about 16 dBU to about 24 dB, or about 18 dBU to about 22 dBU with respect to conventional systems without a transformer.

The bandwidth of the transformer 130 with ground-isolated primary and secondary coils 140, 142 may not cover the entire CATV bandwidth. For example, the transformer 130 may run up to about 500 MHz. The bandwidth coverage may be improved by adding a diplex system that diverts higher frequencies to a high-pass filter (HPF).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A system for suppressing radiofrequency noise, comprising:
a modem comprising a coaxial radiofrequency port that is configured to connect to a first ground;
a transformer comprising:
a first port;
a first coil configured to connect to the first port and the first ground; and
a second coil, wherein the first and second coils are configured to transfer electrical energy therebetween via electromagnetic coupling, and wherein the second coil is configured to connect to a second ground that is isolated from the first ground;
a choke configured to connect to the coaxial radiofrequency port, the first port, and the first ground, wherein the choke is configured to attenuate a shield current traveling therethrough via field conversion, and wherein the choke comprises a coaxial cable that is wrapped one or more times around a toroid;
a power cord comprising a neutral wire that is configured to connect to the choke and the first ground; and
a capacitor configured to connect to the neutral wire, the choke, and the first ground, wherein the capacitor is configured to prevent power signals from traveling therethrough and to cause noise signals to travel back to the modem, wherein the coaxial radiofrequency port comprises:
an outer conductor that is configured to connect to the first ground; and
an inner conductor that is configured to connect to a power source of the modem.

2. The system of claim 1, wherein a first end of the choke is configured to connect to the coaxial radiofrequency port, wherein a second end of the choke is configured to connect to the first port, and wherein the first and second ends each comprise an outer conductor that is configured to connect to the first ground.

3. The system of claim 1, wherein a peak noise level at the inner conductor of the second port is from about 14 dBU to about 26 dBU less than a peak noise level at an inner conductor of the first port.

4. The system of claim 2, wherein the capacitor is configured to connect to the outer conductor of the second end of the choke.

5. The system of claim 2, wherein the transformer further comprises a second port configured to connect to the second coil, wherein the second port comprises an inner conductor and an outer conductor, and wherein the outer conductor of the second port is configured to connect to the second ground.

6. A system for suppressing radiofrequency noise, comprising:
a modem comprising a coaxial radiofrequency port that is configured to connect to a first ground; and
an energy transfer device comprising:
a first portion configured to connect to the coaxial radiofrequency port and the first ground; and
a second portion configured to connect to a second ground that is isolated from the first ground, wherein the first and second portions are configured to transfer electrical energy therebetween via electromagnetic coupling, wherein the coaxial radiofrequency port comprises:
an outer conductor that is configured to connect to the first ground; and
an inner conductor that is configured to connect to a power source of the modem.

7. The system of claim 6, wherein the first portion comprises a first coil, and wherein the second portion comprises a second coil.

8. The system of claim 6, wherein the energy transfer device comprises a single-stage transformer.

9. The system of claim 7, wherein the energy transfer device further comprises:
a first port configured to be connected to and positioned between the coaxial radiofrequency port and the first coil; and
a second port configured to be connected to the second coil, wherein the second port comprises an inner conductor and an outer conductor, and wherein the outer conductor is configured to connect to the second ground.

10. The system of claim 9, wherein the second port is configured to connect to a cable television (CATV) head end.

11. The system of claim 9, wherein a peak noise level at the second port is from about 4 dBU to about 16 dBU less than a peak noise level at the first port.

12. The system of claim 9, wherein a peak noise level at the inner conductor of the second port is from about 4 dBU to about 16 dBU less than a peak noise level at an inner conductor of the first port.

13. A system for suppressing radiofrequency noise, comprising:
a modem comprising a radiofrequency port that is configured to connect to a first ground;
an energy transfer device comprising:
a first portion configured to connect to the first ground; and
a second portion configured to connect to a second ground that is isolated from the first ground, wherein the first and second portions are configured to transfer electrical energy therebetween via electromagnetic coupling; and
a choke configured to be connected to and positioned between to the radiofrequency port and the first portion, wherein the choke comprises a first end that is configured to connect to the coaxial radiofrequency port and a second end that is configured to connect to the first portion, wherein the first and second ends are both configured to connect to the first ground, and wherein the first and second ends of the choke each comprise an outer conductor and an inner conductor, wherein the outer conductors of the first and second ends are configured to connect to the first ground, and wherein the inner conductors of the first and second ends are not configured to connect to the first ground.

14. The system of claim 13, wherein the choke comprises a coaxial cable that is wrapped one or more times around a toroid.

15. The system of claim 13, further comprising a power cord configured to connect to the modem, wherein the power cord comprises a neutral wire that is configured to connect to the first ground and the outer conductor of the second end of the choke.

16. The system of claim 13, wherein the energy transfer device comprises a transformer, wherein the first portion comprises a first port and a first coil, and wherein the second portion comprises a second port and a second coil, wherein the second port comprises an outer conductor and an inner conductor, wherein the outer conductor of the second port is configured to connect to the second ground, and wherein a peak noise level at the inner conductor of the second port is from about 14 dBU to about 26 dBU less than a peak noise level at an inner conductor of the first port.

17. The system of claim 15, further comprising a capacitor configured to connect to the neutral wire, wherein the capacitor is configured to be positioned between the modem and the outer conductor of the second end of the choke.

* * * * *